United States Patent
Hu et al.

(10) Patent No.: US 9,337,723 B2
(45) Date of Patent: May 10, 2016

(54) CHARGE PUMP SYSTEM AND MEMORY

(71) Applicant: Shanghai Huahong Grace Semiconductor Manufacturing Corporation, Shanghai (CN)

(72) Inventors: Jian Hu, Shanghai (CN); Guangjun Yang, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 14/585,720

(22) Filed: Dec. 30, 2014

(65) Prior Publication Data

US 2015/0194878 A1 Jul. 9, 2015

(30) Foreign Application Priority Data

Jan. 7, 2014 (CN) .......................... 2014 1 0005971

(51) Int. Cl.
*G11C 5/14* (2006.01)
*H02M 3/07* (2006.01)

(52) U.S. Cl.
CPC *H02M 3/07* (2013.01); *G11C 5/145* (2013.01)

(58) Field of Classification Search
CPC ............ G11C 5/14; G11C 5/145; H02M 3/07

USPC ................... 365/226, 185.23, 189.09, 189.11
See application file for complete search history.

(56) References Cited

U.S. PATENT DOCUMENTS

| 5,982,222 A * | 11/1999 | Kyung .................. G11C 5/145 |
| | | 327/536 |
| 6,891,764 B2 * | 5/2005 | Li .......................... G11C 16/12 |
| | | 327/536 |

* cited by examiner

*Primary Examiner* — Tan T. Nguyen
(74) *Attorney, Agent, or Firm* — Harness, Dickey & Pierce, P.L.C.

(57) ABSTRACT

Charge pump system and memory are provided. The system includes: a first enabling control unit, adapted to delay at least one start-up signal of the system to obtain and output an oscillating enabling signal after receiving the at least one start-up signal and a voltage boosting enabling signal; a second enabling control unit, adapted to delay the oscillating enabling signal to obtain and output a charge pump enabling signal after receiving the oscillating enabling signal and the voltage boosting enabling signal; a clock oscillating unit, adapted to generate a clock signal after receiving the oscillating enabling signal; and at least one charge pump cell, adapted to output a boosting voltage after receiving the charge pump enabling signal and the clock signal, obtain the voltage boosting enabling signal based on the boosting voltage, and output the voltage boosting enabling signal. Power consumption of the system in a start-up process is reduced.

10 Claims, 4 Drawing Sheets

CHARGE PUMP SYSTEM AND MEMORY

CROSS-REFERENCE TO RELATED APPLICATIONS

The present application claims priority to Chinese patent application No. 201410005971.5, filed on Jan. 7, 2014, and entitled "CHARGE PUMP SYSTEM AND MEMORY", and the entire disclosure of which is incorporated herein by reference.

FIELD OF THE DISCLOSURE

The present disclosure generally relates to semiconductor technology field, and more particularly, to a charge pump system and a memory.

BACKGROUND OF THE DISCLOSURE

With the development of semiconductor technology, semiconductor products are developed to have low power consumption and low cost, thus, a power-supply voltage of a memory is relatively low. However, to realize reading and writing of stored information, a voltage for programming and erasing, which is much higher than the power-supply voltage, is required. Therefore, charge pump systems, which are used to generate a high voltage for programming and erasing from a low power-supply voltage, are widely used in memories.

FIG. 1 schematically illustrates a structural diagram of a charge pump system in existing techniques. Referring to FIG. 1, the charge pump system includes a clock oscillating unit 11, a charge pump circuit 12, a voltage dividing unit 13, a reference voltage generating unit 14 and a voltage comparing unit 15.

An operation process of the charge pump system is described as follows. When the charge pump system is started, the clock oscillator unit 11 generates a clock signal Clk after receiving an oscillation enabling signal, the charge pump circuit 12 boosts a power-supply voltage of the charge pump system to obtain a boosting voltage $V_{EP}$ after receiving a charge pump enabling signal and the clock signal Clk, the voltage dividing unit 13 divides the boosting voltage $V_{EP}$ to obtain a division voltage $V_{DI}$, the reference voltage generating unit 14 generates a reference voltage $V_{REF}$, and the voltage comparing unit 15 compares the division voltage $V_{DI}$ with the reference voltage $V_{REF}$.

Specifically, when the boosting voltage $V_{EP}$ is lower than a predetermined voltage (for example, a voltage for driving loads of the charge pump system to operate), the division voltage $V_{DI}$ output from the voltage dividing unit 13 is lower than the reference voltage $V_{REF}$. Then, the voltage comparing unit 15 may output a voltage boosting enabling signal, to enable the clock oscillator unit 11 to output the clock signal Clk. The charge pump circuit 12 will obtain the boosting voltage under the control of the clock signal Clk.

When the boosting voltage $V_{EP}$ is higher than the predetermined voltage, the division voltage $V_{DI}$ output from the voltage dividing unit 13 is higher than the reference voltage $V_{REF}$. The voltage comparing unit 15 may output an invalidation signal, to enable the clock oscillator unit 11 to stop oscillating. Thus, the clock oscillator unit 11 will stop providing the clock signal Clk to the charge pump circuit 12, so that the charge pump circuit 12 stops the voltage boosting process.

From above, when the boosting voltage $V_{EP}$ is higher than the predetermined voltage, the charge pump circuit 12 stops working, thereby reducing power consumption of the charge pump system. However, in practice, the charge pump system causes great power consumption in a start-up process.

SUMMARY

In one embodiment of the present disclosure, a charge pump system is provided, including: a first enabling control unit, adapted to, after receiving at least one start-up signal of the charge pump system and a voltage boosting enabling signal, delay the at least one start-up signal to obtain an oscillating enabling signal and output the oscillating enabling signal; a second enabling control unit, adapted to, after receiving the oscillating enabling signal and the voltage boosting enabling signal, delay the oscillating enabling signal to obtain a charge pump enabling signal and output the charge pump enabling signal; a clock oscillating unit, adapted to, after receiving the oscillating enabling signal, generate a clock signal; and at least one charge pump cell, adapted to, after receiving the charge pump enabling signal and the clock signal, output a boosting voltage, obtain the voltage boosting enabling signal based on the boosting voltage, and output the voltage boosting enabling signal.

Optionally, each of the at least one charge pump cell may include: a charge pump circuit, adapted to boost a power-supply voltage of the charge pump system to obtain a boosting voltage after receiving the clock signal and the charge pump enabling signal; a voltage dividing unit, adapted to divide the boosting voltage to obtain a division voltage; a reference voltage generating unit, adapted to output a reference voltage after receiving the at least one start-up signal; and a voltage comparing unit adapted to: compare the division voltage with the reference voltage, and output the voltage boosting enabling signal when the division voltage is lower than the reference voltage.

Optionally, for how long the at least one start-up signal is delayed by the first enabling control unit may be related to a duration spent for generating a stable reference voltage by the reference voltage generating unit, and for how long the oscillating enabling signal is delayed by the second enabling control unit may be related to a duration spent for generating a stable clock signal by the clock oscillating unit.

Optionally, the charge pump enabling signal received by the at least one charge pump cell is output by the second enabling unit and is generated by: the second enabling control unit delaying the oscillating enabling signal after receiving the oscillating enabling signal from the first enabling control unit and the boosting enabling signal from the at least one charge pump cell.

Optionally, the first enabling control unit includes a first delaying unit, a first NOR gate circuit and at least one first processing unit which corresponds to the at least one charge pump cell, respectively, where the first delaying unit is adapted to delay the at least one start-up signal to obtain and output a first delaying signal, each of the at least one first processing unit includes a first phase inverter and a second NOR gate circuit, the first phase inverter is adapted to invert the voltage boosting enabling signal to obtain and output a first inversion signal, the second NOR gate circuit is adapted to perform NOR operation to the first delaying signal and the first inversion signal to obtain and output a first processing signal, and the first NOR gate circuit is adapted to receive the first processing signal output from the at least one first processing unit and perform NOR operation to the first processing signal to obtain the oscillating enabling signal.

Optionally, the second enabling control unit includes a second delaying unit and at least one second processing unit which corresponds to the at least one charge pump cell, respectively, where the second delaying unit is adapted to delay the oscillating enabling signal to obtain and output a second delaying signal, each of the at least one second processing unit includes a second phase inverter and a third NOR gate circuit, the second phase inverter is adapted to invert the voltage boosting enabling signal to obtain and output a second inversion signal, the third NOR gate circuit is adapted to perform NOR operation to the second delaying signal and the second inversion signal to obtain the charge pump enabling signal.

Optionally, the at least one charge pump cell may include two charge pump cellts, the at least one start-up signal may include a first start-up signal and a second start-up signal, and the first enabling control unit includes a third delaying unit, a fourth delaying unit, a third processing unit and two fourth processing units which correspond to the two charge pump cells respectively, where the third delaying unit is adapted to delay the first start-up signal to obtain and output a third delaying signal, the fourth delaying unit is adapted to delay the second start-up signal to obtain and output a fourth delaying signal, each fourth processing unit includes a third phase inverter and a fourth NOR gate circuit, the third phase inverter is adapted to invert the voltage boosting enabling signal to obtain and output a third inversion signal, the fourth NOR gate circuit is adapted to perform NOR operation to the third delaying signal, the fourth delaying signal and the third inversion signal to obtain and output a second processing signal, the third processing unit includes a first OR gate circuit, a second OR gate circuit, a fifth NOR gate circuit and a sixth NOR gate circuit, the second OR gate circuit is adapted to perform OR operation to the second processing signals output from the two fourth processing units to obtain and output a third processing signal, the fifth NOR gate circuit is adapted to perform NOR operation to the third processing signal and a fourth processing signal output from the first OR gate circuit to obtain and output a fifth processing signal, and the sixth NOR gate circuit is adapted to perform NOR operation to the fifth processing signal and an inversion signal of the first start-up signal to obtain the oscillating enabling signal.

Accordingly, in one embodiment, a memory is provided, including the above charge pump system and a plurality of memory cells arranged in arrays, where the charge pump system is adapted to provide a reading voltage for a word line and a source line connected with the memory cells when the memory cells are read.

Optionally, the first OR gate circuit may be adapted to perform OR operation to a reading operation signal, a programming operation signal and an erasing operation signal of the memory to obtain and output the fourth processing signal.

Optionally, the first start-up signal may be an inversion signal of a deep-power-down mode signal of the memory, and the second start-up signal may be an inversion signal of a power-on-reset mode signal of the memory.

Compared with the existing techniques, the present disclosure may have following advantages. The start-up signal of the charge pump system is delayed by the first enabling control unit to obtain the oscillating enabling signal which lags behind the start-up signal. The oscillating enabling signal enables the clock oscillating unit to start working after the reference voltage generating unit generates the stable reference voltage. The oscillating enabling signal is delayed by the second enabling control unit to obtain the charge pump enabling signal which lags behind the oscillating enabling signal. The charge pump enabling signal enables the charge pump circuit to start working after the clock oscillating unit generates the stable clock signal.

Based on the delaying process in the first and second enabling control units, the reference voltage generating unit, the clock oscillating unit and the charge pump circuit start working in turn. When the charge pump circuit starts working, the reference voltage and the clock signal have reached stability, that is, the charge pump circuit is started under the clock signal having a stable frequency. Therefore, power consumption of the charge pump circuit in a start-up process may be reduced, and further power consumption of the whole charge pump system in the start-up process may be reduced.

DETAILED DESCRIPTION OF THE DISCLOSURE

As described in background, conventional charge pump systems have relatively great power consumption in a start-up process. Power consumption of a charge pump circuit is related to a frequency of a received clock signal. The lower the frequency of the received clock signal is, the less the power consumption of the charge pump circuit is; and vice versa.

Figure 1:
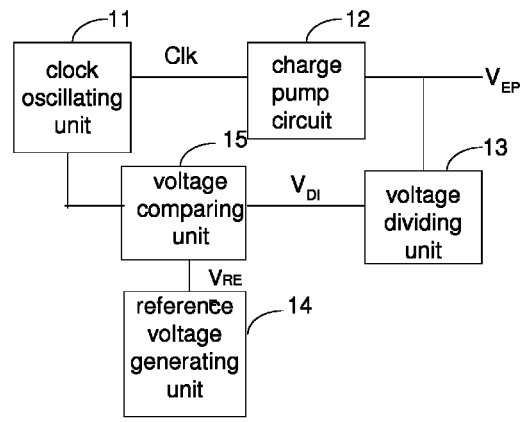
FIG. 1 schematically illustrates a structural diagram of a charge pump system in existing techniques.

In the charge pump system shown in FIG. 1, without taking delay caused by component properties into consideration, the clock oscillating unit 11 and the charge pump circuit 12 start to operate at a same time. However, it takes a time period for the clock signal Clk output from the clock oscillating unit 11 to reach stability. The clock signal Clk in a unstable state has a higher frequency than that a stable state. Under the control of the unstable clock signal Clk, the power consumption of the charge pump circuit 12 is relatively great, which further results in great power consumption of the charge pump system in a start-up process.

Figure 2:
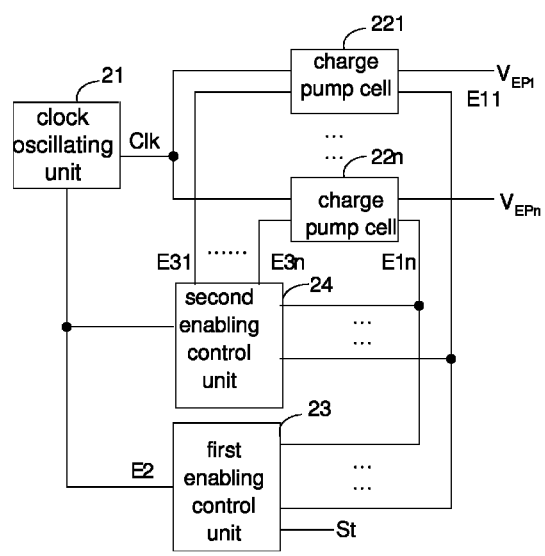
FIG. 2 schematically illustrates a structural diagram of a charge pump system according to an embodiment of the present disclosure.

In an embodiment, a charge pump system is provided. FIG. 2 schematically illustrates a structural diagram of the charge pump system. Referring to FIG. 2, the charge pump system includes a clock oscillating unit 21, a first enabling control unit 23, a second enabling control unit 24 and at least one charge pump cell.

The clock oscillating unit 21 is adapted to generate a clock signal Clk after receiving an oscillating enabling signal E2. In some embodiments, the clock oscillating unit 21 may be an oscillating circuit including a quartz crystal oscillator or a RC oscillating circuit, which is not limited herein. No matter what circuit structure the clock oscillating unit 21 has, an enabling terminal should be contained in the clock oscillating unit 21.

Operation of the clock oscillating unit 21 may be determined based on a signal received at the enabling terminal. When the enabling terminal receives the oscillating enabling signal E2, the clock oscillating unit 21 may start to oscillate and generate the clock signal Clk. When the clock oscillating unit 21 doesn't receive the oscillating enabling signal E2, that is, a signal at the enabling terminal is invalid, the clock oscillating unit 21 stops oscillating and doesn't generate the clock signal Clk.

In some embodiments, the oscillating enabling signal E2 may be a high electric level signal or a low electric level signal, which may depend on a practical circuit of the clock oscillating unit 21. When the oscillating enabling signal E2 is a high electric level signal, the invalid signal received at the enabling terminal is a low electric level signal; and when the oscillating enabling signal E2 is a low electric level signal, the invalid signal received at the enabling terminal is a high electric level signal.

In some embodiments, the at least one charge pump cell includes n charge pump cells including a charge pump 221 to a charge pump 22n, where n>=1. The charge pump cells may be adapted to output a boosting voltage after receiving a charge pump enabling signal and the clock signal Clk, obtain a voltage boosting enabling signal based on the boosting voltage, and output the voltage boosting enabling signal.

The n charge pump cells share the clock signal Clk, and each charge pump cell receives one charge pump enabling signal, respectively. For example, the charge pump cell 221 is adapted to receive the charge pump enabling signal E31, and the charge pump cell 22n is adapted to receive the charge pump enabling signal E3n. Under the control of the charge pump enabling signals, each corresponding charge pump cell boosts a power-supply voltage of the charge pump system to output a boosting voltage, obtains a voltage boosting enabling signal based on the boosting voltage, and outputs the voltage boosting enabling signal.

For example, the charge pump cell 221 is adapted to output a boosting voltage $V_{EP1}$, and obtains a voltage boosting enabling signal E11 based on the boosting voltage $V_{EP1}$; and the charge pump cell 22n is adapted to output a boosting voltage $V_{EPn}$, and obtains a voltage boosting enabling signal E12 based on the boosting voltage $V_{EPn}$.

Figure 3:
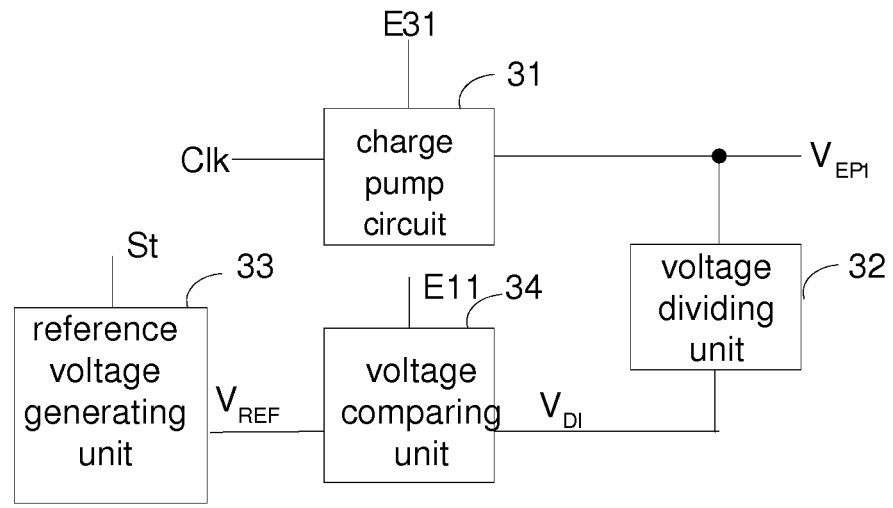
FIG. 3 schematically illustrates a structural diagram of a charge pump cell according to an embodiment of the present disclosure.

In some embodiments, the n charge pump circuits may have a same circuit structure. The charge pump cell 221 is described as an example. FIG. 3 schematically illustrates a structural diagram of the charge pump cell 221 according to an embodiment of the present disclosure. Referring to FIG. 3, the charge pump cell 221 includes a charge pump circuit 31, a voltage dividing unit 32, a reference voltage generating unit 33 and a voltage comparing unit 34.

The charge pump circuit 31 may be adapted to boost the power-supply voltage of the charge pump system to obtain the boosting voltage $V_{EP1}$ after receiving the clock signal Clk and the charge pump enabling signal E31. Those skilled in the art can understand that, the charge pump circuit 31 may have various circuit structures. In some embodiments, the charge pump circuit 31 may be an on-off regulator booster pump, non-regulating capacitive charge pump or a regulating capacitive charge pump.

The voltage dividing unit 32 may be adapted to divide the boosting voltage $V_{EP1}$ to obtain a division voltage $V_{DI}$. The voltage dividing unit 32 may be a resistive voltage dividing circuit or a MOS transistor voltage dividing circuit in a diode connection mode, which is not limited herein.

The reference voltage generating unit 33 may be adapted to output a reference voltage $V_{REF}$ after receiving a start-up signal St of the charge pump system. Assuming that the charge pump system is applied in an integrated circuit system, when the integrated circuit system is in an operation mode which does not require a voltage provided in the charge pump system, such as an idle mode, the charge pump system may not operate. When the charge pump system is required to operate, the integrated circuit system may provide the start-up signal St to the charge pump system.

In some embodiments, there are a plurality of start-up signals St. Any one of the plurality of start-up signals St can start up the charge pump system. For example, assuming that the charge pump system is applied in a memory, when the memory is in a deep-power-down mode, the charge pump system does not operate; and when the memory is in a power-on-reset mode, the charge pump system works. Therefore, the start-up signal St may be an inversion signal of a deep-power-down mode signal of the memory, or an inversion signal of a power-on-reset mode signal of the memory. In some embodiments, the deep-power-down mode signal of the memory may be a high electric level signal, and the power-on-reset mode signal of the memory may be a low electric level signal.

In some embodiments, the reference voltage generating unit 33 may be a bandgap voltage reference source and adapted to generate the reference voltage $V_{REF}$. The reference voltage $V_{REF}$ may have a voltage value determined by a target voltage of the boosting voltage $V_{EP1}$ and a voltage dividing ratio in the voltage dividing unit 32. The target voltage of the boosting voltage $V_{EP1}$ denotes to a voltage which drives loads of the charge pump cell 221 to work. The voltage dividing ratio of the voltage dividing unit 32 denotes to a ratio of the $V_{DI}$ to the boosting voltage $V_{EP1}$.

In some embodiments, the reference voltage $V_{REF}$ may be equal to a product of the target voltage of the boosting voltage $V_{EP1}$ and the voltage dividing ratio in the voltage dividing unit 32. For example, if the target voltage of the boosting voltage $V_{EP1}$ is 2.5V and the voltage dividing ratio in the voltage dividing unit 32 is 0.2, the reference voltage $V_{REF}$ is 0.5V.

The voltage comparing unit 34 may be adapted to compare the division voltage $V_{DI}$ with the reference voltage $V_{REF}$, and output the voltage boosting enabling signal E11 when the division voltage $V_{DI}$ is lower than the reference voltage $V_{REF}$. In some embodiments, the voltage comparing unit 34 may be a voltage comparator.

The voltage boosting enabling signal E11 may be a high electric level or a low electric level. For example, the voltage boosting enabling signal E11 is a high electric level. When the boosting voltage $V_{EP1}$ is lower than its target voltage, the division voltage $V_{DI}$ output from the voltage dividing unit 32 is lower than the reference voltage $V_{REF}$, thus, the voltage comparing unit 34 outputs a high electric level. When the boosting voltage $V_{EP1}$ is higher than its target voltage, the division voltage $V_{DI}$ output from the voltage dividing unit 32 is higher than the reference voltage $V_{REF}$, thus, the voltage comparing unit 34 outputs a low electric level.

Referring to FIG. 2, the first enabling control unit 23 may be adapted to delay the start-up signal St to obtain and output the oscillating enabling signal E2 after receiving the start-up signal St and the voltage boosting enabling signal.

As described above, the n charge pump cells are provided with the oscillating signal Clk by the clock oscillating unit 21 which operates under the control of the oscillating enabling signal E2. After the first enabling control unit 23 receives the start-up signal St, the charge pump system is started. If any one of the n charge pump cells sends a voltage boosting signal to the first enabling control unit 23, the first enabling control unit 23 generates and outputs the oscillating enabling signal E2. If none of the n charge pump cells sends a voltage boosting signal to the first enabling control unit 23, the first enabling control unit 23 will not generate the oscillating enabling signal E2.

The first enabling control unit 23 delaying the start-up signal St means delaying a rising edge signal or a falling edge signal of the start-up signal St when it is input into the first enabling control unit 23. In some embodiments, if the start-up signal St is a high electric level signal, the first enabling control unit 23 may delay the rising edge signal thereof when the start-up signal St comes; and if the start-up signal St is a low electric level signal, the first enabling control unit 23 may delay the falling edge signal thereof when the start-up signal St comes.

In some embodiments, a time for delaying the start-up signal St by the first enabling control unit 23 may be related to a time for generating a stable reference voltage by the reference voltage generating unit 33. In some embodiments, the time for delaying the start-up signal St by the first enabling control unit 23 may be longer than or equal to the time for the reference voltage to reach stability. That is to say, only after the stable reference voltage is output from the reference voltage generating unit 33, the first enabling control unit 23 generates the oscillating enabling signal E2.

Figure 4:
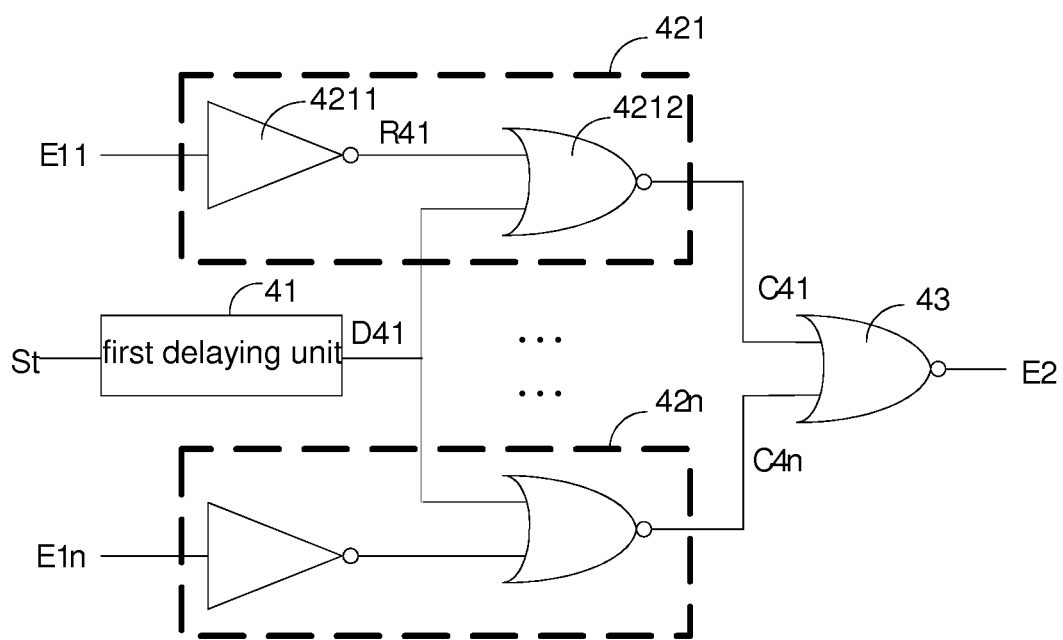
FIG. 4 schematically illustrates a structural diagram of a first enabling control unit according to an embodiment of the present disclosure.

FIG. 4 schematically illustrates a structural diagram of the first enabling control unit 23 according to an embodiment of the present disclosure. Referring to FIG. 4, the first enabling control unit 23 includes a first delaying unit 41, a first NOR gate circuit 43 and at least one first processing unit which corresponds to the at least one charge pump cell, respectively.

In the following example, the oscillating enabling signal E2 is a high electric level signal. The first delaying unit 41 is adapted to delay the start-up signal St to obtain and output a first delaying signal D41. If the start-up signal St is a high electric level signal, the first delaying unit 41 may be a falling edge delaying circuit having a phase inversion function; and if the start-up signal St is a low electric level signal, the first delaying unit 41 may be a falling edge delaying circuit. Based on the delaying by the first delaying unit 41, the first delaying signal D41 may be a low electric level signal which lags behind the start-up signal St.

In some embodiments, each charge pump cell corresponds to one first processing unit. For example, the charge pump cell 221 corresponds to a first processing unit 421, the charge pump cell 22n corresponds to a first processing unit 42n, and so on.

In some embodiments, the first processing unit 421 may include a first phase inverter 4211 and a second NOR gate circuit 4212.

An input terminal of the first phase inverter 4211 is adapted to receive the voltage boosting enabling signal E11. The second NOR gate circuit 4212 has two input terminals, where one input terminal is connected with an output terminal of the first phase inverter 4211, and the other input terminal is connected with an output terminal of the first delaying unit 41.

The first phase inverter 4211 may be adapted to invert the voltage boosting enabling signal E11 to obtain and output a first inversion signal R41. The second NOR gate circuit 4212 may be adapted to receive the first delaying signal D41 and the first inversion signal R41, and perform NOR operation to the first delaying signal D41 and the first inversion signal R41 to obtain and output a first processing signal C41.

The first processing unit 42n may be similar to the first processing unit 421, and is not described in detail here. The first processing unit 42n may be adapted to output the first processing signal C4n.

In some embodiments, the first NOR gate circuit 43 may have n input terminals each of which is connected with an output terminal of one corresponding first processing unit. The first NOR gate circuit 43 may be adapted to receive the first processing signals output from the n first processing units and perform NOR operation to the first processing signals to obtain the oscillating enabling signal E2.

Referring to FIG. 2, the second enabling control unit 24 may be adapted to delay the oscillating enabling signal E2 to obtain and output the charge pump enabling signal after receiving the oscillating enabling signal E2 and the voltage boosting enabling signal.

The charge pump enabling signal received by the charge pump cell may be the charge pump enabling signal output from the second enabling control unit 24 which is obtained by delaying the oscillating enabling signal E2. After the second enabling control unit 24 receives the oscillating enabling signal E2, if any one of n charge pump cells sends a voltage boosting signal to the second enabling control unit 24, the second enabling control unit 24 will generate and output the charge pump enabling signal correspond to the charge pump cell.

The second enabling control unit 24 delaying the oscillating enabling signal E2 means delaying a rising edge signal or a falling edge signal of the oscillating enabling signal E2 when it is input into the second enabling control unit 24. In some embodiments, if the oscillating enabling signal E2 is a high electric level signal, the second enabling control unit 24 may delay the rising edge signal thereof when the oscillating enabling signal E2 comes; and if the oscillating enabling signal E2 is a low electric level signal, the second enabling control unit 24 may delay the falling edge signal thereof when the oscillating enabling signal E2 comes.

In some embodiments, a time for delaying the oscillating enabling signal E2 by the second enabling control unit 24 may be related to a time for generating a stable clock signal Clk by the clock oscillating unit 21. In some embodiments, the time for delaying the oscillating enabling signal E2 by the second enabling control unit 24 may be longer than or equal to the time for the clock signal Clk to reach stability. That is to say, only after the stable clock signal Clk is output from the clock oscillating unit 21, the second enabling control unit 24 generates the charge pump enabling signal.

Figure 5:
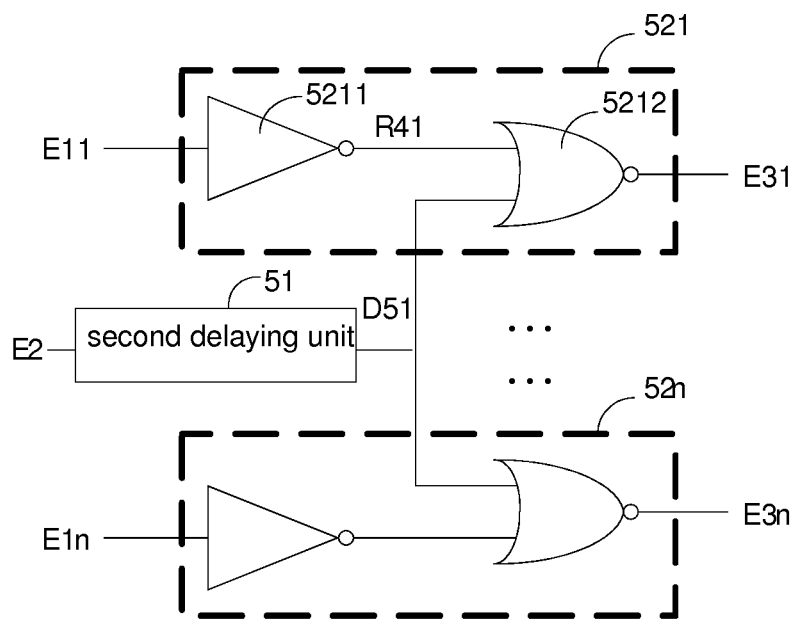
FIG. 5 schematically illustrates a structural diagram of a second enabling control unit according to an embodiment of the present disclosure.

FIG. 5 schematically illustrates a structural diagram of the second enabling control unit 24 according to an embodiment of the present disclosure. Referring to FIG. 5, the second enabling control unit 24 includes a second delaying unit 51, and at least one second processing unit which corresponds to the at least one charge pump cell, respectively.

In the following example, both the oscillating enabling signal E2 and the charge pump enabling signal are high electric level signals. The second delaying unit 51 is adapted to delay the oscillating enabling signal E2 to obtain and output a second delaying signal D51. As the oscillating enabling signal E2 is a high electric level signal, the second delaying unit 51 may be a falling edge delaying circuit having a phase inversion function. Based on the delaying by the second delaying unit 51, the second delaying signal D51 may be a low electric level signal which lags behind the oscillating enabling signal E2.

In some embodiments, each charge pump cell corresponds to one second processing unit. For example, the charge pump cell 221 corresponds to a second processing unit 521, the charge pump cell 22n corresponds to a second processing unit 52n, and so on.

In some embodiments, the second processing unit 521 may include a second phase inverter 5211 and a third NOR gate circuit 5212.

An input terminal of the second phase inverter 5211 is adapted to receive the voltage boosting enabling signal E11. The third NOR gate circuit 5212 has two input terminals, where one input terminal is connected with an output terminal of the second phase inverter 5211, and the other input terminal is connected with an output terminal of the second delaying unit 51.

The second phase inverter 5211 may be adapted to invert the voltage boosting enabling signal E11 to obtain and output a second inversion signal R51, the third NOR gate circuit 5212 may be adapted to receive the second delaying signal D51 and the second inversion signal R51, and perform NOR operation to the second delaying signal D51 and the second inversion signal R51 to obtain the charge pump enabling signal E31.

The second processing unit 52n may be similar to the second processing unit 521, and is not described in detail here. The second processing unit 52n may be adapted to output the charge pump enabling signal E3n.

Hereinafter, a start-up process of the charge pump system is described according to an embodiment.

When the charge pump system receives the start-up signal St, the charge pump system is started. Under the control of the start-up signal St, the reference voltage generating unit in each charge pump cell generates the reference voltage. After the reference voltage reaches stability, the first enabling control unit 23 outputs the oscillating enabling signal E2. Under the control of the oscillating enabling signal E2, the clock oscillating unit 21 generates the clock signal Clk. After the clock signal Clk reaches stability, the second enabling control unit 24 generates the charge pump enabling signals. Under the control of the charge pump enabling signal, the charge pump cells operate.

Based on the delaying process in the first second enabling control unit 23 and second enabling control unit 24, the reference voltage generating unit 33, the clock oscillating unit 21 and the charge pump circuit 31 start working in turn. When the charge pump circuit starts working, the reference voltage and the clock signal Clk have reached stability, that is, the charge pump circuit 31 is started under the clock signal Clk having a stable frequency. Therefore, power consumption of the charge pump circuit 31 in the start-up process may be reduced, and further power consumption of the whole charge pump system in the start-up process may be reduced.

In order to clarify the objects, characteristics and advantages of the disclosure, embodiments of present disclosure will be described in detail in conjunction with accompanying drawings.

In practice, in different integrated circuit systems provided with charge pump systems, the first enabling control unit may have different structures. In the following embodiment, a charge pump system, which provides a reading voltage for a flash memory, applied in the memory is described.

Figure 6:
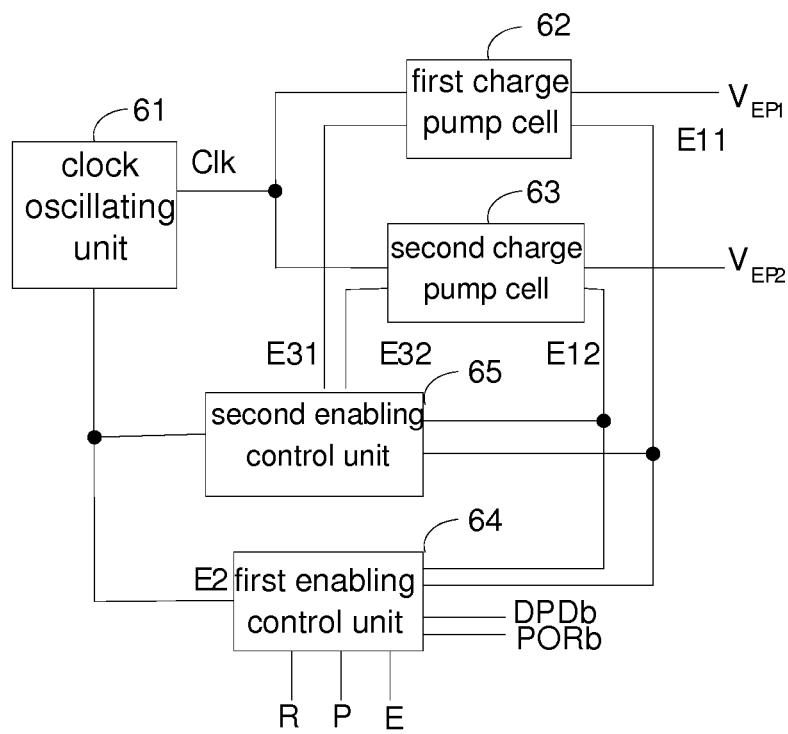
FIG. 6 schematically illustrates a structural diagram of a charge pump system according to an embodiment of the present disclosure.

FIG. 6 schematically illustrates a structural diagram of the charge pump system according to an embodiment of the present disclosure. The charge pump system is adapted to provide a reading voltage for a word line and a source line connected with a memory cell when the memory cell is read. Referring to FIG. 6, the charge pump system includes a clock oscillating unit 61, a first charge pump cell 62, a second charge pump cell 63, a first enabling control unit 64 and a second enabling control unit 65.

The clock oscillating unit 61 is adapted to generate a clock signal Clk after receiving an oscillating enabling signal E2. The first charge pump cell 62 is adapted to output a boosting voltage $V_{EP1}$ after receiving a charge pump enabling signal E31 and the clock signal Clk, where the boosting voltage $V_{EP1}$ is a reading voltage for a word line. The second charge pump cell 63 is adapted to output a boosting voltage $V_{EP2}$ after receiving a charge pump enabling signal E32 and the clock signal Clk, where the boosting voltage $V_{EP2}$ is a reading voltage for a source line.

Detailed information of the clock oscillating unit 61, the first charge pump cell 62, the second charge pump cell 63 and the second enabling control unit 65 is similar with that in the above embodiment.

In some embodiments, a start-up signal of the charge pump system includes a first start-up signal and a second start-up signal. The first enabling control unit 64 may be further adapted to receive an operation signal of a memory. The first start-up signal may be an inversion signal DPDb of a deep-power-down mode signal of the memory, and the second start-up signal may be an inversion signal PORb of a power-on-reset mode signal of the memory. The operation signal of the memory may include a reading operation signal R, a programming operation signal P and an erasing operation signal E.

Figure 7:
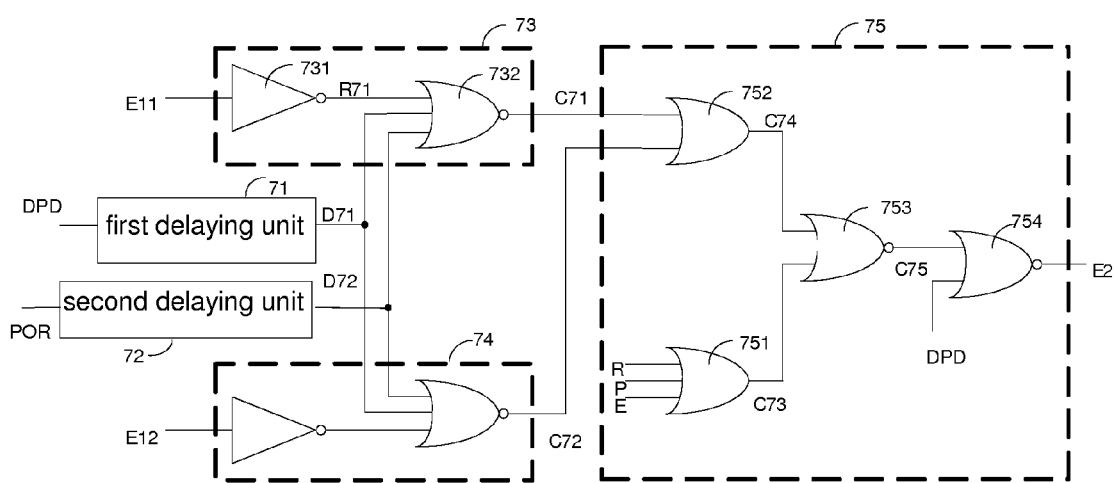
FIG. 7 schematically illustrates a structural diagram of a first enabling control unit according to an embodiment of the present disclosure.

FIG. 7 schematically illustrates a structural diagram of the first enabling control unit 64 according to an embodiment of the present disclosure. Referring to FIG. 7, the first enabling control unit 64 includes a first delaying unit 71, a second delaying unit 72, a first processing unit 75 and two second processing units 73 and 74 which correspond to the charge pump cells, respectively.

The first delaying unit 71 is adapted to delay the first start-up signal (i.e., the inversion signal DPDb of the deep-power-down mode signal of the memory) to obtain and output a first delaying signal D71. Generally, a deep-power-down mode signal DPD of a memory is a high electric level signal, thus, the first start-up signal is a low electric level signal. As a result, the first delaying unit 71 may be a falling edge delaying circuit. Based on the delaying by the first delaying unit 71, the first delaying signal D71 may be a low electric level signal which lags behind the first start-up signal.

The second delaying unit 72 is adapted to delay the second start-up signal (i.e., the inversion signal PORb of a power-on-reset mode signal of the memory) to obtain and output a second delaying signal D72. Generally, a power-on-reset mode signal of a memory is a low electric level signal, thus, the second start-up signal is a high electric level signal. As a result, the second delaying unit 72 may be a falling edge delaying circuit having an inversion function. Based on the delaying by the second delaying unit 72, the second delaying signal D72 may be a low electric level signal which lags behind the second start-up signal.

In some embodiments, each charge pump cell corresponds to one second processing unit. For example, the first charge pump cell 62 corresponds to the second processing unit 73, and the second charge pump cell 63 corresponds to the second processing unit 74.

In some embodiments, the second processing unit 73 includes a first phase inverter 731 and a first NOR gate circuit 732.

An input terminal of the first phase inverter 731 is adapted to receive the voltage boosting enabling signal E11. The first NOR gate circuit 732 has three input terminals, where a first input terminal is connected with an output terminal of the first phase inverter 731, a second input terminal is connected with an output terminal of the first delaying unit 71, and a third input terminal is connected with an output terminal of the second delaying unit 72.

The first phase inverter 731 may be adapted to invert the voltage boosting enabling signal E11 to obtain and output a first inversion signal R71. The first NOR gate circuit 732 may be adapted to receive the first delaying signal D71, the second delaying signal D72 and the first inversion signal R71, and perform NOR operation to the first delaying signal D71, the second delaying signal D72 and the first inversion signal R71 to obtain and output a first processing signal C71.

The second processing unit 74 may be similar to the second processing unit 73, and is not described in detail here. The second processing unit 74 may be adapted to output a first processing signal C72.

The first processing unit 75 includes a first OR gate circuit 751, a second OR gate circuit 752, a second NOR gate circuit 753 and a third NOR gate circuit 754.

The first OR gate circuit 751 has three input terminals, and is adapted to receive the reading operation signal R, the programming operation signal P and the erasing operation signal E, perform OR operation to the reading operation signal R, the programming operation signal P and the erasing operation signal E, and obtain and output a second processing signal C73.

The second OR gate circuit 752 has two input terminals, where one input terminal is connected with an output terminal of the second processing unit 73, and the other input terminal is connected with an output terminal of the second processing unit 74. The second OR gate circuit 752 is adapted to receive the first processing signals C71 and C72, and perform OR operation to the first processing signals C71 and C72, to obtain and output a third processing signal C74.

The second NOR gate circuit 753 has two input terminals, where one input terminal is connected with an output terminal of the first OR gate circuit 751, and the other input terminal is connected with an output terminal of the second OR gate circuit 752. The second NOR gate circuit 753 is adapted to receive the second processing signal C73 and the third processing signal C74, and perform NOR operation to the second processing signal C73 and the third processing signal C74, to obtain and output a fourth processing signal C75.

The third NOR gate circuit 754 has two input terminals, where one input terminal is connected with an output terminal of the second NOR gate circuit 753, and the other input terminal is adapted to receive the deep-power-down mode signal DPD of the memory. The third NOR gate circuit 754 is adapted to perform NOR operation to the fourth processing signal C75 and the deep-power-down mode signal DPD of the memory, to obtain and output the oscillating enabling signal E2.

In the charge pump system provided in the embodiments of the present disclosure, when the memory is in the deep-power-down mode, neither the first start-up signal nor the second start-up signal is generated, thus, the charge pump system does not work. When the memory is performed with the reading operation, the programming operation or the erasing operation, the first start-up signal or the second start-up signal is generated, thus, the charge pump system will be started.

In an embodiment, a memory is provided, including a charge pump system and a plurality of memory cells arranged in arrays, where the charge pump system is adapted to provide a reading voltage for a word line and a source line connected with the memory cells when the memory cells are read. The charge pump system may have a structure as illustrated in FIG. 6.

From above, in the charge pump systems provided in embodiments of the present disclosure, a generating order of enabling signals in each circuit unit in the charge pump system is controlled, to enable the charge pump circuit to start operating after the clock signal reaches stability. That is, the charge pump circuit is started when the clock signal have a stable frequency, which may reduce power consumption of the charge pump circuit in a start-up process, and further reduce power consumption of the whole charge pump system in the start-up process.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A charge pump system, comprising:
   a first enabling control unit, adapted to: after receiving at least one start-up signal of the charge pump system and a voltage boosting enabling signal, delay the at least one start-up signal to obtain an oscillating enabling signal, and output the oscillating enabling signal;
   a second enabling control unit, adapted to: after receiving the oscillating enabling signal and the voltage boosting enabling signal, delay the oscillating enabling signal to obtain a charge pump enabling signal, and output the charge pump enabling signal;
   a clock oscillating unit, adapted to, after receiving the oscillating enabling signal, generate a clock signal; and
   at least one charge pump cell, adapted to: after receiving the charge pump enabling signal and the clock signal, output a boosting voltage, obtain the voltage boosting enabling signal based on the boosting voltage, and output the voltage boosting enabling signal.

2. The charge pump system according to claim 1, wherein each of the at least one charge pump cell comprises:
   a charge pump circuit, adapted to: after receiving the clock signal and the charge pump enabling signal, boost a power-supply voltage of the charge pump system to obtain a boosting voltage;
   a voltage dividing unit, adapted to divide the boosting voltage to obtain a division voltage;
   a reference voltage generating unit, adapted to: after receiving the at least one start-up signal, output a reference voltage; and
   a voltage comparing unit adapted to: compare the division voltage with the reference voltage, and output the voltage boosting enabling signal when the division voltage is lower than the reference voltage.

3. The charge pump system according to claim 2, wherein for how long the at least one start-up signal is delayed by the first enabling control unit is related to a duration spent for generating a stable reference voltage by the reference voltage generating unit, and for how long the oscillating enabling signal is delayed by the second enabling control unit is related to a duration spent for generating a stable clock signal by the clock oscillating unit.

4. The charge pump system according to claim 1, wherein the charge pump enabling signal received by the at least one charge pump cell is output by the second enabling unit and is generated by: the second enabling control unit delaying the oscillating enabling signal after receiving the oscillating enabling signal from the first enabling control unit and the boosting enabling signal from the at least one charge pump cell.

5. The charge pump system according to claim 1, wherein the first enabling control unit comprises a first delaying unit, a first NOR gate circuit and at least one first processing unit which corresponds to the at least one charge pump cell, respectively, where the first delaying unit is adapted to: delay the at least one start-up signal to obtain a first delaying signal, and output the first delaying signal;

each of the at least one first processing unit comprises a first phase inverter and a second NOR gate circuit, where the first phase inverter is adapted to: invert the voltage boosting enabling signal to obtain a first inversion signal, and output the first inversion signal, the second NOR gate circuit is adapted to: perform NOR operation to the first delaying signal and the first inversion signal to obtain a first processing signal, and output the first processing signal; and the first NOR gate circuit is adapted to receive the first processing signal output from the at least one first processing unit and perform NOR operation to the first processing signal to obtain the oscillating enabling signal.

6. The charge pump system according to claim 1, wherein the second enabling control unit comprises a second delaying unit and at least one second processing unit which corresponds to the at least one charge pump cell, respectively, where the second delaying unit is adapted to: delay the oscillating enabling signal to obtain a second delaying signal, and output the second delaying signal; and each of the at least one second processing unit comprises a second phase inverter and a third NOR gate circuit, where the second phase inverter is adapted to: invert the voltage boosting enabling signal to obtain a second inversion signal, and output the second inversion signal, and the third NOR gate circuit is adapted to perform NOR operation to the second delaying signal and the second inversion signal to obtain the charge pump enabling signal.

7. The charge pump system according to claim 1, wherein the at least one charge pump cell comprises two charge pump cells, the at least one start-up signal comprises a first start-up signal and a second start-up signal, and the first enabling control unit comprises a third delaying unit, a fourth delaying unit, a third processing unit and two fourth processing units which correspond to the two charge pump cells respectively, where the third delaying unit is adapted to: delay the first start-up signal to obtain a third delaying signal, and output the third delaying signal, the fourth delaying unit is adapted to: delay the second start-up signal to obtain a fourth delaying signal, and output the fourth delaying signal;

each fourth processing unit comprises a third phase inverter and a fourth NOR gate circuit, the third phase inverter is adapted to: invert the voltage boosting enabling signal to obtain a third inversion signal, and output the third inversion signal, the fourth NOR gate circuit is adapted to: perform NOR operation to the third delaying signal, the fourth delaying signal and the third inversion signal to obtain a second processing signal, and output the second processing signal; and the third processing unit comprises a first OR gate circuit, a second OR gate circuit, a fifth NOR gate circuit and a sixth NOR gate circuit, where the second OR gate circuit is adapted to: perform OR operation to the second processing signals output from the two fourth processing units to obtain a third processing signal, and output the third processing signal, the fifth NOR gate circuit is adapted to: perform NOR operation to the third processing signal and a fourth processing signal output from the first OR gate circuit to obtain a fifth processing signal, and output the fifth processing signal, and the sixth NOR gate circuit is adapted to perform NOR operation to the fifth processing signal and an inversion signal of the first start-up signal to obtain the oscillating enabling signal.

8. A memory, comprising: a plurality of memory cells arranged in arrays and the charge pump system according to claim 7, where the charge pump system is adapted to provide a reading voltage for a word line and a source line connected with the memory cells when the memory cells are read.

9. The memory according to claim 8, wherein the first OR gate circuit is adapted to: perform OR operation to a reading operation signal, a programming operation signal and an erasing operation signal of the memory to obtain the fourth processing signal, and output the fourth processing signal.

10. The memory according to claim 8, wherein the first start-up signal is an inversion signal of a deep-power-down mode signal of the memory, and the second start-up signal is an inversion signal of a power-on-reset mode signal of the memory.

\* \* \* \* \*